United States Patent [19]

Li

[11] 4,172,158
[45] Oct. 23, 1979

[54] METHOD OF FORMING A PHOSPHORUS-NITROGEN-OXYGEN FILM ON A SUBSTRATE

[75] Inventor: Pei-Ching Li, Hopewell Junction, N.Y.

[73] Assignee: International Business Machines Corporation, Armonk, N.Y.

[21] Appl. No.: 772,804

[22] Filed: Feb. 28, 1977

[51] Int. Cl.$^2$ ............................................. B05D 5/12
[52] U.S. Cl. ............................. 427/85; 252/62.3 R; 357/52; 427/82; 427/126; 427/248 C; 427/255
[58] Field of Search ...................... 427/85, 255, 82, 87, 427/126, 248 A, 248 B, 248 C; 252/62.3 R; 423/299, 302, 304; 357/52

[56] References Cited

U.S. PATENT DOCUMENTS

| | | | |
|---|---|---|---|
| 3,486,951 | 12/1969 | Norby | 252/62.3 R |
| 3,524,776 | 8/1970 | Hampikian et al. | 427/85 |
| 3,660,179 | 5/1972 | Desmond et al. | 252/62.3 R |
| 3,666,574 | 5/1972 | Tarneja et al. | 427/82 |
| 3,931,039 | 1/1976 | Yamashita et al. | 252/62.3 R |

*Primary Examiner*—Michael F. Esposito
*Assistant Examiner*—Sadie L. Childs
*Attorney, Agent, or Firm*—George O. Saile

[57] ABSTRACT

A method is described which forms amorphous phosphorus-nitrogen-oxygen material having excellent thermal stability and low reactivity to a wide variety of chemicals. The material is manufactured using a chemical vapor deposition process. The reaction chamber is maintained at a temperature between about 400°–900° C. with a suitable substrate placed therein. Reaction gases containing phosphorus-nitrogen-bearing compounds and a source of oxygen are passed through the chamber to deposit the phosphorus-nitrogen-oxygen film onto the substrate.

10 Claims, 9 Drawing Figures

METHOD OF FORMING A PHOSPHORUS-NITROGEN-OXYGEN FILM ON A SUBSTRATE

BACKGROUND OF THE INVENTION

The invention relates to a new composition of matter which is an amorphous-phosphorus-nitrogen-oxygen material which has excellent physical characteristics and a method for manufacturing the material as well as applications.

DESCRIPTION OF THE PRIOR ART

Phosphorus and nitrogen compositions have been known and are described, for example, in the C. G. Miner U.S. Pat. No. 1,634,795, C. G. Christian U.S. Pat. No. 2,884,318, H. Ulrich U.S. Pat. No. 3,859,418 and M. Yamashita et al U.S. Pat. No. 3,931,039. The principal use of these nitride materials have been in fertilizers or plant foods. Another proposed use was as a diffusing source for phosphorus into silicon wafers to produce N-type regions in the production of semiconductor devices such as transistors and integrated circuits. It has been in this context that the Yamashita et al U.S. Pat. No. 3,931,039 describes in its prior art a method for forming a phosphorus nitride coating in column 1 of the patent. It is pointed out in this patent that the phosphorus nitride coating is thermally unstable and readily decomposes. The patent goes on to describe a method for forming a thermally stable phosphorus nitride-silicon dioxide composition which is usable as a diffusion source of N-type impurities for the formation of semiconductor devices.

SUMMARY OF THE PRESENT INVENTION

In accordance with the present invention, an amorphous phosphorus-nitrogen-oxygen coating is described which is thermally stable and unattacked by a wide variety of normally very reactive chemicals. The coating composition is manufactured by chemically reacting vapor phosphorus and nitrogen compounds to form a phosphorus nitrogen coating at temperatures between about 400°–900° C. An excellent physical property coating is formed by the addition of a gaseous oxygen source in the reaction gases to bring a oxygen component to the phosphorus nitrogen composition.

DESCRIPTION OF THE PREFERRED EMBODIMENTS

Figure 1:
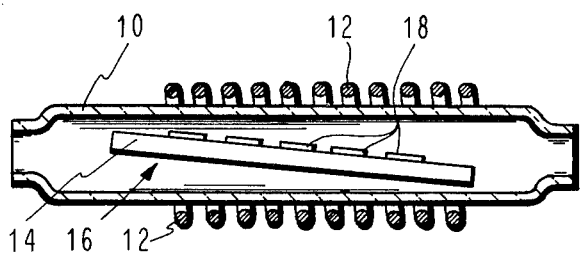
FIG. 1 illustrates one form of reaction chamber for manufacturing the composition of the present invention.

FIG. 1 illustrates the apparatus for forming the amorphous phosphorus-nitrogen-oxygen material of the present invention. The apparatus includes a fused quartz (silicon dioxide) reactor tube 10. Surrounding the reactor wall is an induction heating coil 12 for heating the reactor and anything therein. Within the reactor is a graphite susceptor 14 which is enclosed in a fused quartz (silicon dioxide) envelope 16. Substrates 18 such as silicon semiconductor wafers are positioned over the graphite susceptor. The temperature of the substrates 18 are raised by RF induction heating process until the substrate temperature is between about 400°–900° C. The reaction gases containing phosphorus, nitrogen and oxygen source are then passed through the chamber where the deposition of the amorphous phosphorus-nitrogen-oxygen material occurs onto the substrates 18. The preferred gases are phosphine ($PH_3$), ammonia ($NH_3$) and oxygen ($O_2$) with nitrogen carrier gas.

Figure 2:
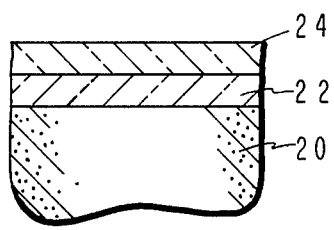
FIGS. 2 and 3 illustrate structures in using the composition of the present invention in electronic semiconductor structures.
Figure 3:
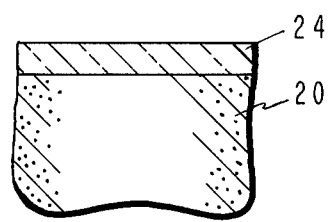

Examples of the resulting structures are shown in FIGS. 2 and 3. FIG. 2 illustrates a silicon wafer 20 having a silicon dioxide coating 22 thereon and a phosphorus nitrogen oxygen coating of the present invention 24 over the silicon dioxide coating 22. FIG. 3 illustrates a silicon substrate 20 having the phosphorus nitrogen oxygen coating 24 of the present invention directly on the silicon substrate. Semiconductor devices may be formed within the silicon substrate 20 and the coating 24 can act either as a passivating coating or a masking coating for diffusion or ion implantation steps.

The presence of oxygen in the resulting phosphorus nitrogen product is critical so that the coating will adhere properly to substrates and will be stable and not be decomposed as would oxygen free coatings of phosphorus nitride at ordinary temperatures. Oxygen is preferably brought into the compound by the addition of oxygen gas to the reaction gases. The addition of oxygen also rapidly promotes the deposition rate.

Figure 4:
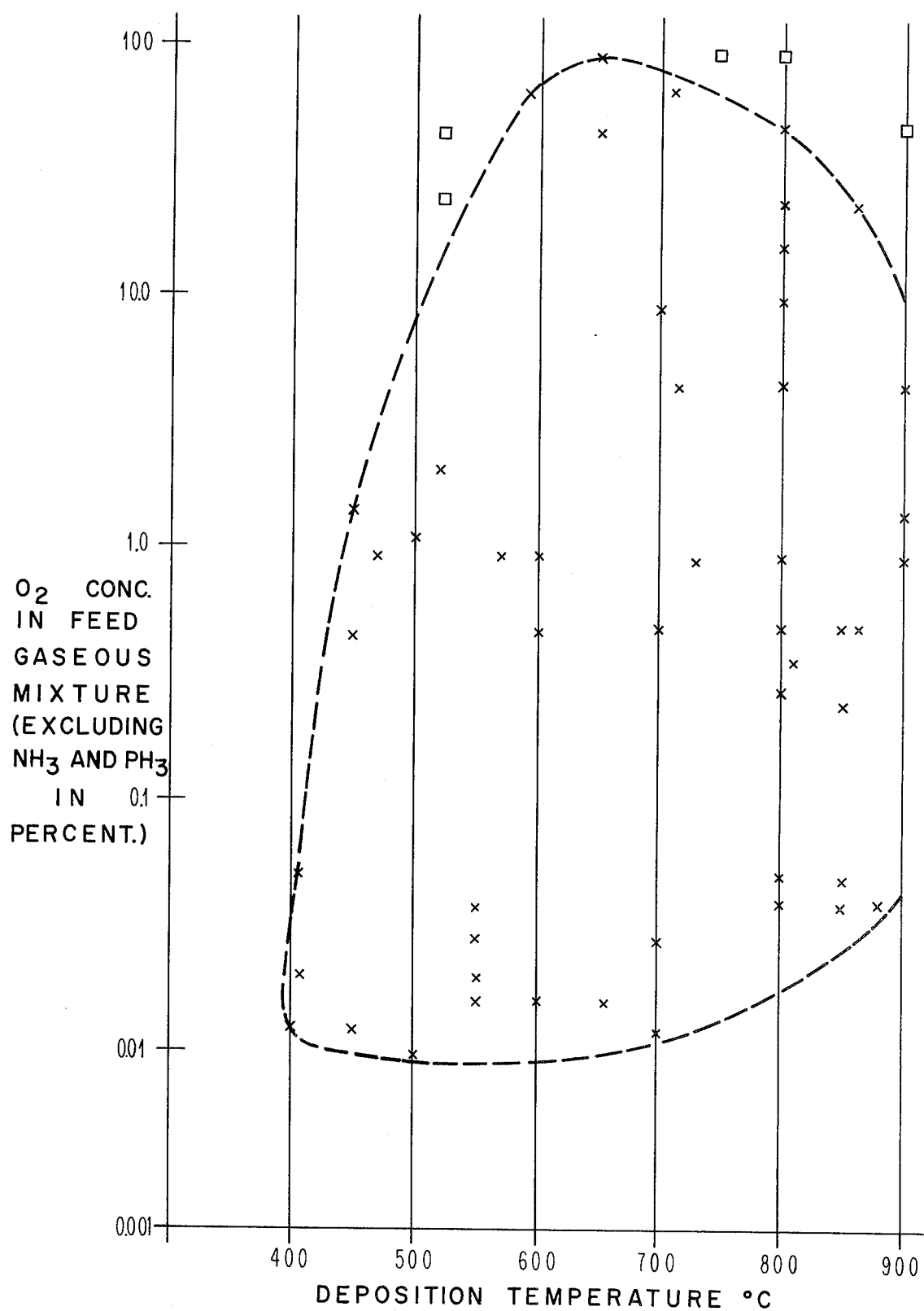
FIG. 4 is a graphical representation of the formation region of the composition as it is dependent upon the oxygen source concentration in the feed gaseous mixture versus the deposition temperature.

FIG. 4 illustrates the formation region of the phosphorus nitrogen oxygen amorphous composition over the deposition temperature range of about 400°–900° C. The oxygen concentration in the feed gaseous mixture is from 0.01 to about 98% excluding the ammonia and phosphine. The crosses indicate data points where good adhering and stable coatings were formed. The squares indicate points of no deposition of the material of the present invention. The preferred gaseous materials for deposition of the coating of phosphorus-nitrogen-oxygen is ammonia, phosphine and oxygen. This is because such gases are available in high purity and in simple molecular form. Consequently, undesirable side reactions can be minimized. Furthermore, source materials in gaseous state provide the great easiness for CVD process control. Other gaseous materials which could be used in place of phosphine, ammonia and oxygen are P, $P_2O_5$, $NH_4Cl$, $N_2O$, NO, etc. When P, $P_2O_5$ and $NH_4Cl$ are used, they have to be preheated to suitable temperature, and their vapor can be swept into the reaction chamber by inert carrier gas. Suitable carrier gases in addition to nitrogen are He, Ar, and other inert gases or mixtures thereof.

Figure 5:
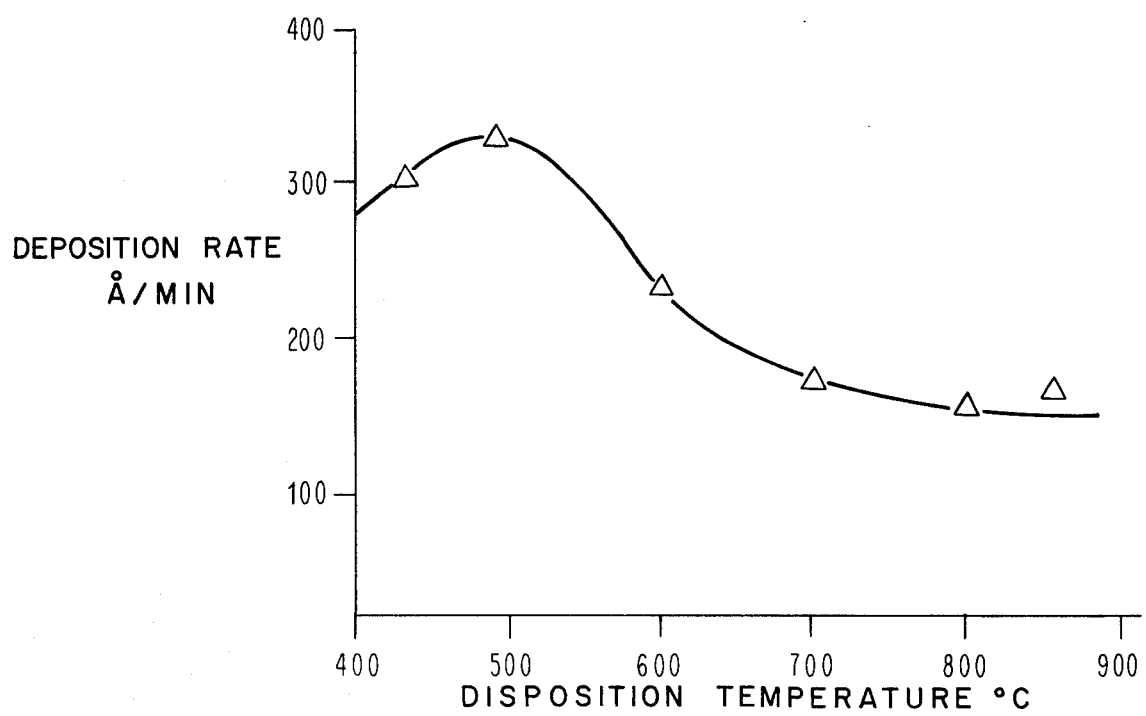
FIG. 5 illustrates the effect of deposition temperature upon deposition rate.

Referring to FIG. 5, there is shown the deposition rate in Angstroms/minute versus the deposition temperature for the chemical vapor deposition using phosphine, ammonia, oxygen and nitrogen carrier gas at a given feed rate of phosphine, 2.12 cc/min. It is seen that the deposition rate peaks at about 500° C. deposition temperature. The deposition rate then drops down to the level of somewhat less than 200 Angstroms/min. around 800° C. This deposition rate with respect to deposition temperature can be higher or lower depending on the feed rates of source materials, particularly the phosphine concentration.

The chemical vapor deposited (CVD) phosphorus-nitrogen-oxygen film is a coherent, homogeneous, amorphous material. The processes take place in the deposition. These include, simultaneously, chemical reactions, mass and energy transfers. The overall reaction is as follows:

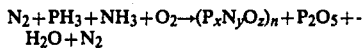

$$N_2 + PH_3 + NH_3 + O_2 \rightarrow (P_xN_yO_z)_n + P_2O_5 + H_2O + N_2$$

in which $(P_xN_yO_z)_n$ is CVD formed dense material, free of any crystallinity. $P_2O_5$ and $H_2O$ appear to be the essential reaction by-products along with unidentified trace products in the existing gaseous stream. Microprobe analysis of the film (5000 to 7000 A thickness) with chemical formula shown above, $(P_xN_yO_z)_n$, indicates X value varying from 30 to 32 atomic percent, y value from 36 to 48 atomic percent and z value from 21 to 33 atomic percent depending on the oxygen concentration in the feed gases mixture as well as deposition temperature.

Preferred composition in terms of wt.% of P—N—O film in the formula $(P_xN_yO_z)_n$ is:

P—48-50 Wt.%
N—29-36 Wt.%
O—10-27 Wt.%

These Wt.% ranges may vary somewhat when deposition temperatures are above or below 650° C.

Figure 8:
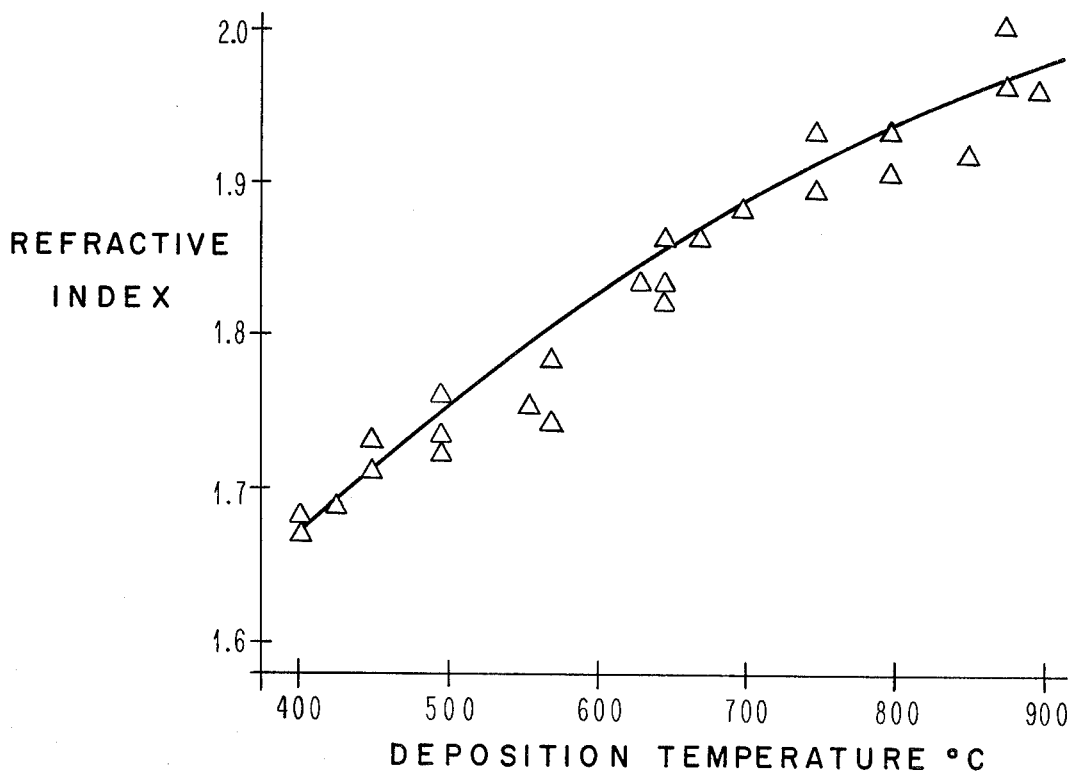
FIG. 8 shows the relationship between the deposition temperature of the material of the present invention versus the refractive index of the resulting coating.

FIG. 8 illustrates the preferred composition region of $(P_xN_yO_z)_n$ at 650° C. FIG. 8 gives O, N and P in atomic percent. The TABLE I gives for Points 4–10 the deposition conditions and O, N and P in the resultant film in weight percent.

TABLE I

| Point # | Temp. °C. | $O_2$ % in Gaseous Feed Mixture | Wt. % O | Wt. % N | Wt. % P |
|---|---|---|---|---|---|
| 4 | 650 | 0.015 | 16.24±0.49 | 33.86±0.37 | 49.89±0.30 |
| 5 | 650 | 0.35 | 20.93±1.92 | 30.52±0.76 | 48.54±1.28 |
| 6 | 650 | 24 | 21.32±0.75 | 29.58±0.54 | 49.09±0.79 |
| 7 | 650 | 47.6 | 21.51±1.77 | 29.71±1.24 | 48.76±0.72 |
| 8 | 650 | 91 | 26.44±0.57 | 25.77±0.41 | 47.78±0.77 |
| 9 | 650 | 0.35(100 cc/min.) ($B_2H_6$) | 10.06±1.48 | 35.50±0.51 | 50.42±1.19 |
| 10 | 800 | 24 (300 cc/min. ($B_2H_6$) | 16.57±0.94 | 35.74±0.60 | 47.67±0.63 |

Figure 6:
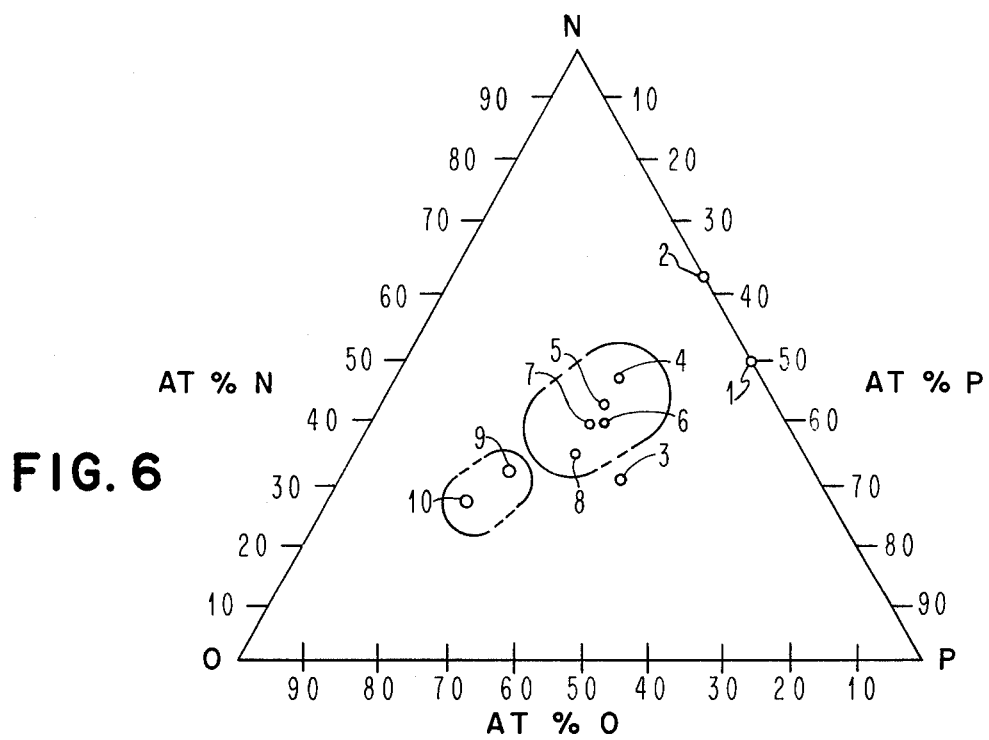
FIG. 6 shows compositions of P-N-O and boron doped P-N-O coatings fabricated at 650° C.

Points 1 and 2 represent the compounds PN and $P_3N_5$, respectively, and Point 3 the simple PON compound. All of these known compounds are prepared by methods other than the CVD process. Points 8 and 9 of FIG. 6 represent boron doped $(P_xN_yO_z)_n$ films at 650° C. and 800° C. Compositions of the doped films shown in this P-N-O diagram are arrived at by neglecting the boron content because the light boron element is beyond the test probe detection capability. The $(P_xN_yO_z)_n$ film when deposited on a thick silicon wafer with thickness of about 1 micron, exhibits three broad, strong characteristic absorption bands centered at 1230, 910 and 480 cm$^{-1}$. These bands show very feeble shift with variation of oxygen concentration during deposition.

Figure 7:
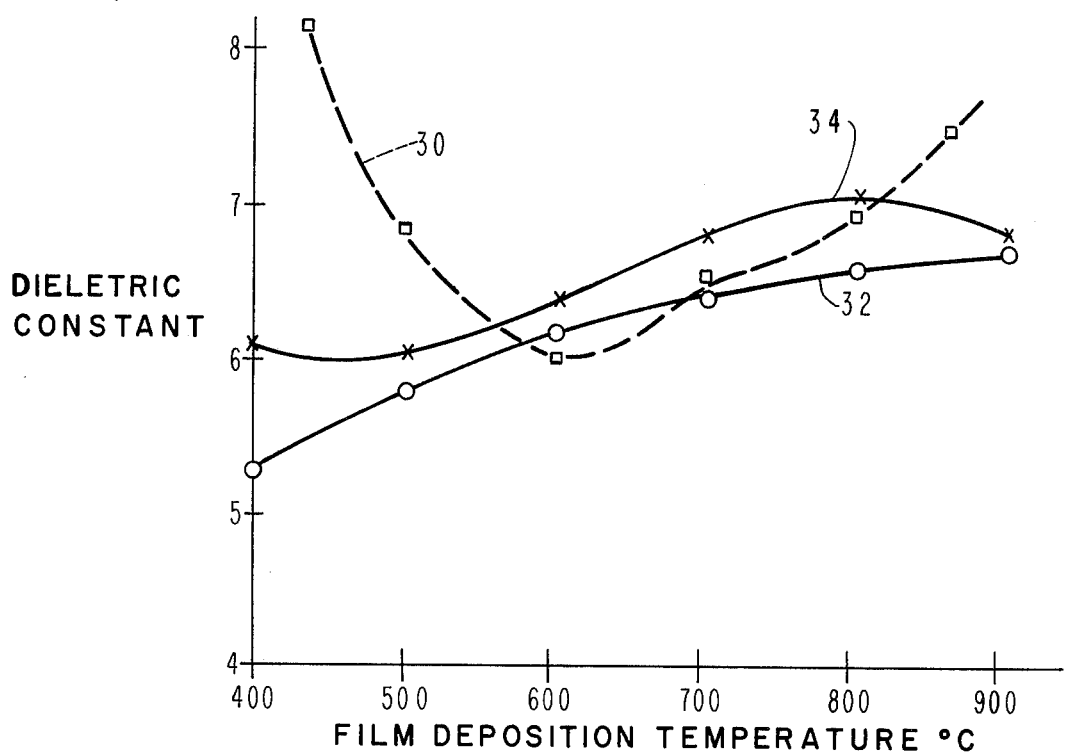
FIG. 7 compares the dielectric constant versus deposition temperature of the composition of the present invention with that of silicon nitride.

Referring now to FIG. 7, the dielectric constant of the phosphorus-nitrogen-oxygen film varies from 8 to about 6 depending upon the film deposition temperature as shown from this graph. The highest dielectric constant is obtainable at the lower film deposition temperatures. However, the dielectric constant does increase at the higher deposition temperatures of the order of 800°–900° C. wherein it approaches the higher dielectric constant obtained at the low approximately 400° C. film deposition. The minimum film dielectric constant of the material is obtained in the order of 600° C. The graph compares the present material, curve 30, to silicon nitride as deposited 32 and silicon nitride after a 20 hour 1000° C. nitrogen annealing 34. Prolonged annealing of $Si_3N_4$ generally increases the dielectric constant due to an extensive increase of crystallinity of silicon nitride. With the exception of the present material deposited at temperatures below 550° C., this truly amorphous material has comparable dielectric constant to silicon nitride with or without post-deposition anneal.

The refractive index is also dependent upon the deposition temperature as shown by FIG. 8. The data points on this graph show experimental points where coatings of the phosphorus-nitrogen-oxygen material were deposited at the various deposition temperatures using the CVD chemical vapor deposition process of phosphine, ammonia, and nitrogen carrier gas. The results show that a steady increase in the refractive index is obtained when moving from the 400° C. deposition temperature to the 900° C. deposition temperature in the refractive index from about 1.6 to 2.0 as determined at wavelength 5461 A.

The dielectric constant of the present material is also dependent on oxygen concentration as well as the deposition temperature. TABLE II illustrates examples of such property dependence.

TABLE II

| Deposition Temp. °C. | Refractive Index n at 5461A | Film Thickness in A | $O_2$ cc/min | $N_2$ liter per min. | $O_2$ % in Feed | Dielectric Constant |
|---|---|---|---|---|---|---|
| 860 | 1.89 | 1046 | 5000 | 15.5 | 24.4 | 6.95 |
| 800 | 1.942 | 960 | 10 | 20.5 | 0.05 | 7.49 |
| 800 | 1.931 | 813 | 8 | 20.5 | 0.039 | 6.8 |
| 550 | 1.711 | 1130 | 4 | 10.5 | 0.038 | 6.3 |
| 550 | 1.722 | 1151 | 2 | 10.5 | 0.019 | 6.3 |
| 500 | 1.717 | 1169 | 2 | 8.8 | 0.0235 | 6.2 |
| 450 | 1.682 | 1189 | 2 | 7.5 | 0.0266 | 6.74 |
| 655 | 1.876 | 1000 | 2 | 12.5 | 0.016 | 6.8 |
| 850 | 1.961 | 882 | 8 | 20.5 | 0.039 | 7.08 |
| 610 | 1.772 | 863 | 2 | 12.5 | 0.016 | 6.58 |
| 800 | 1.857 | 1229 | 5000 | 15.5 | 24.4 | 6.54 |
| 650 | 1.747 | 1299 | 5000 | 5.5 | 47.6 | 6.7 |
| 700 | 1.931 | 922.7 | 2 | 16.5 | 0.012 | 6.75 |

The TABLE III indicates the dielectric breakdown strength (accumulation mode) for the phosphorus-nitrogen-oxygen coatings deposited on the bare silicon substrates using phosphine, ammonia, oxygen and nitrogen carrier gas.

TABLE III

| Deposition Temp. °C. | Breakdown Strength, $\times 10^6$ V/cm |
|---|---|
| 500 | 13.8 |
| 600 | 14.7 |
| 700 | 12.8 |
| 800 | 84 |
| 860 | 10 |

The dielectric breakdown strength of TABLE III was measured by the ramp method on 20 mil diameter aluminum dot over the P-N-O film of approximately 1000 A on N type (100) Si substrates. For comparison purpose, all the breakdown strength was calculated based on equivalent silicon dioxide thickness. As compared to $Si_3N_4$ films deposited on Si substrates in the same temperature range, the breakdown strength of P-N-O film is two to three times better than that of silicon nitride. In comparison with $Si_3N_4$, P-N-O coating not only shows higher dielectric breakdown strength, but also exhibits better compatibility to silicon substrate. Films of the P-N-O coating up to 2 microns in thickness on silicon do not cause any stress cracking or substrate warpage. $Si_3N_4$ on silicon substrate generally shows cracks and warpage when its thickness reaches 0.8 microns.

The phosphorus-nitrogen-oxygen material is very stable and does not decompose at normal temperatures in the range of 900° C. The material is not attacked by water, sulphuric acid, hydrochloric acid, hydrofluoric acid, phosphoric acid, ammonium hydroxide, hydrogen peroxide, ammonium hydroxide plus hydrogen peroxide, hydrogen peroxide plus hydrochloric acid, nitric acid, hydrofluoric acid plus nitric acid, aqua regia, sodium hydroxide solution (about 50%), pyrocatechol-ethylemediamine-water system. It is not even wetted by hydrofluoric acid solution.

The stability of the material is such it is difficult to etch using normal chemical etching techniques. Reactive ion etching may be satisfactorily accomplished using a carbon tetrachloride system. For example, in carbon tetrachloride reactive ion etching at a temperature of 225° C. will etch the phosphorus-nitrogen-oxygen material at about 30 Angstroms per second.

Figure 9:
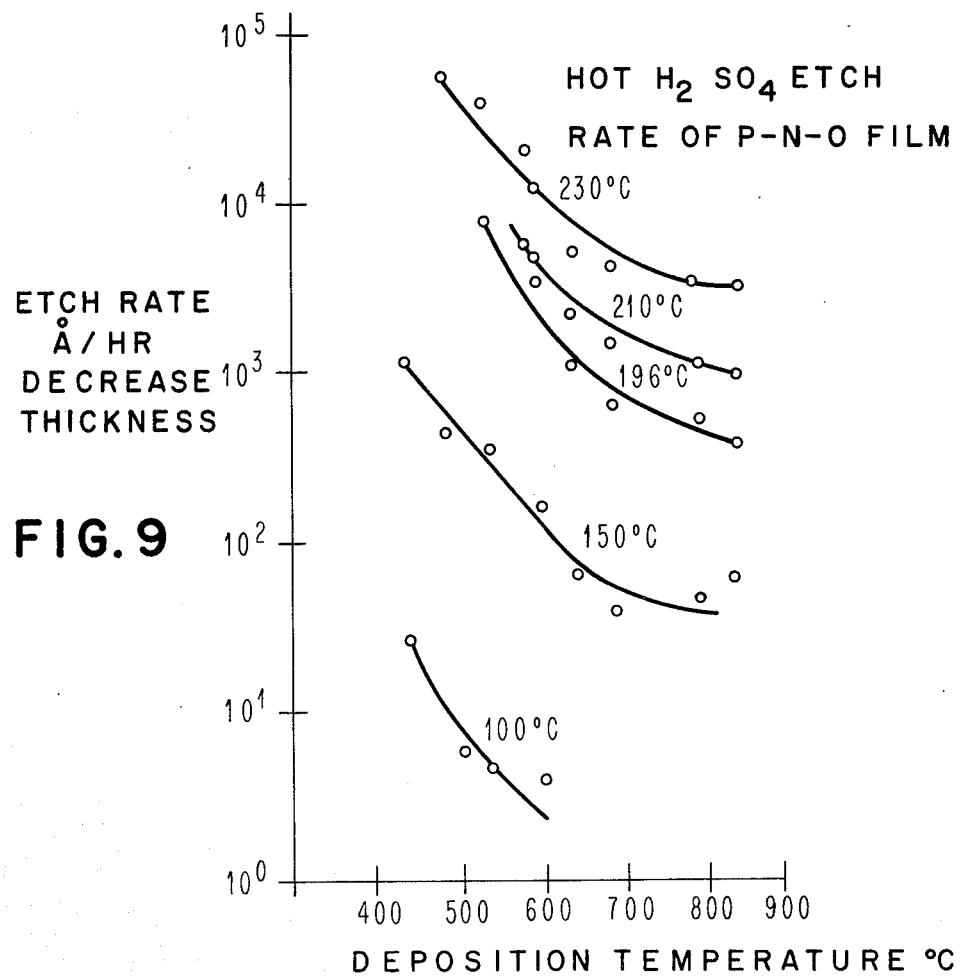
FIG. 9 illustrates the etch rate of coatings with $H_2SO_4$ at temperatures from 100° C. to 230° C.

The P-N-O material is virtually not attacked by concentrated sulfuric acid ($H_2SO_4$) at temperatures below 100° C. The material, however, can be chemically etched only with concentrated $H_2SO_4$ at elevated temperatures. FIG. 9 shows the etch rate of the material using 96% $H_2SO_4$ at temperatures from 100° C. to 230° C. For pattern definition, the P-N-O film is CVD coated with approximately 1000 A $SiO_2$, then processed with conventional photolithography etching off unwanted oxide area. High temperature concentrated $H_2SO_4$ etch will remove the P-N-O film through the opened oxide window. The preferred etching temperature using $H_2SO_4$ is above about 190° C. and below the boiling or fuming point of $H_2SO_4$.

There are many applications where this phosphorus-nitrogen-oxygen amorphous material because of its excellent stability and ability to withstand chemical attack. One important application would be as a diffusion source for phosphorus into silicon wafers. This diffusion would produce an N type region in silicon which is important in the manufacture of transistors and integrated circuits. High levels of phosphorus concentration in the diffused region can be produced from the present coating of in the order of $10^{20}$ to $10^{21}$ atoms per cc. and the junction depth of 1.2 to 1.4 microns. Diffusion was carried out at 1000° C. or higher in $O_2$ ambient. P-N-O film deposited on Si wafers of 0.5 to 1 microns in thickness was positioned in about 0.030" away from the device to be diffused. The time at temp. is about ½ to 1 hour with $O_2$ at 1 liter/min. flowing through the reaction tube.

Another important application is the use of the P-N-O film in FET memory devices in the gate region. The structure would be, for example:

(1) Metal/P-N-O film/silicon device (MPS).
(2) Metal/P-N-O film/$SiO_2$ silicon device (MPOS).
(3) Silicon/P-N-O film/$SiO_2$/silicon device (SPOS).

TABLE IV gives experimental data on MPOS [Al metal$(P_xN_yO_z)_n$-$SiO_2$-Si] device where a 20 mil diameter Al dot on $(P_xN_yO_z)_n$ over 200 A $SiO_2$ on P(100) Si substrate.

TABLE IV

| Temp. °C. | $O_2$ % | Equivalent Oxide A | $V_{FB}$ | Net Charge per cm$^2$ |
|---|---|---|---|---|
| 800 | 0.034 | 289 | −1.20V | $2.87 \times 10^{11}$ |
| 850 | 0.034 | 268 | −1.10V | $2.32 \times 10^{11}$ |
| 700 | 0.014 | 291 | −1.20V | $2.85 \times 10^{11}$ |
| 600 | 0.016 | 323 | −1.12V | $2.06 \times 10^{11}$ |
| 500 | 0.024 | 320 | −0.99V | $1.23 \times 10^{11}$ |
| 450 | 0.026 | 310 | −0.96V | $1.07 \times 10^{11}$ |

Other applications include wire insulation, capacitor, protective coating for integrated circuits or other uses, such as etching mask.

The following examples are included merely to aid in the understanding of the invention and variations may be made by one skilled in the art without departing from the spirit and scope of the invention.

EXAMPLE 1

Silicon substrates were placed on the graphite susceptor of the horizontal reactor shown in FIG. 1. The reactor was 3¼" by 2¼" and 30" long. The induction heating was turned on and the temperature of the silicon substrates was raised to between 400° and 900° C. depending upon the particular experiment within this example. Constant gaseous feed rates of phosphine $PH_3$ was 2.1 cc/min. and ammonia $NH_3$ was 200 cc/min. The oxygen content in the nitrogen carrier gas was varied. The oxygen was varying from 1 to 5000 cc/min. and $N_2$ from 0.1 liters/min. to 20.5 liters/min. depending on the deposition temperature. In FIG. 4, the lowest amount of $O_2$ in the feed is one cc/min. and the highest 5000 cc/min. The maximum $N_2$ in the feed mixture is 20.5 liters/min. At each deposition temperature there is a favorable total feed rate so that the most uniform film thickness can be produced. The total flow rate generally increases with deposition temperature. Films in FIG. 4 have thickness varying from approximately 1000 A to a few microns. The crosses and squares on FIG. 4 are actual data points of deposition temperature in °C. versus oxygen concentration in feed gaseous mixture excluding ammonia and phosphine. It is seen from the FIG. 4 that the phosphorus-nitrogen-oxygen material is only successfully formed within the dashed line. Outside of this dashed line either no deposition occurred or unstable coating occured.

EXAMPLE 2

A silicon wafer having a phosphorous-nitrogen-oxygen coating thereon was subjected to boiling water at the deposition temperatures of 470°, 500° and 700° C. The coating was not affected after 7 days of continuous subjection to boiling water.

EXAMPLE 3

Phosphorus-nitrogen-oxygen coating at temperatures above 450° C. was not affected after 12 days of continuous subjection to room temperature water.

EXAMPLE 4

Silicon wafers having phosphorous-nitrogen-oxygen coatings thereon were formed at the film deposition temperatures specified in the TABLE V. The wafers were subjected to a temperature of 1000° C. in $O_2$ for one hour. The coatings disappeared. The wafers were then cleaned with HF and rinsed in $H_2O$. The diffusion results showed a shallow junction of 0.18 to 0.29 microns, surface concentration in the order of $10^{19}$ atoms/$cm^3$ and sheet resistance from 300 to 1000 ohm/square. The data showed no dependence of film deposition temperature.

TABLE V

| | Film Deposition Temp. °C. | Junction Depth, Microns | Surface Concentration in atoms/$cm^3$ | Sheet Resistance ohm/square |
|---|---|---|---|---|
| 4A | 400 | 0.29 | $10^{19.2}$ | 240 |
| 4B | 450 | 0.19 | $10^{18.7}$ | 1003 |
| 4C | 650 | 0.18 | $10^{18.5}$ | 951 |
| 4D | 750 | 0.21 | $10^{19.2}$ | 418 |
| 4E | 900 | 0.25 | $10^{19.2}$ | 309 |

While the invention has been particularly shown and described with reference to preferred embodiments thereof, it will be understood by those skilled in the art that the foregoing and other changes in form and details may be made without departing from the spirit and scope of the invention.

What is claimed is:

1. A method for forming phosphorus-nitrogen-oxygen film comprising:
    providing a reaction chamber having a substrate temperature of about 400° to 900° C. with a suitable substrate; and
    passing the reaction gases $PH_3$, $NH_3$ and a gas which is a source of oxygen through the chamber to deposit said phosphorus-nitrogen-oxygen film onto said substrate.
2. The method of claim 1 wherein the said gas which is a source of oxygen is $O_2$.
3. The method of claim 1 wherein the reaction chamber has a substrate temperature of about 450° to 850° C.
4. The method of claim 2 wherein the said $O_2$ gas is greater than about 0.01% of the reaction gas mixture.
5. The method of claim 1 wherein gas feed rates are between about 0.5 and 2.5 cc/min. for $PH_3$ and between about 100 cc/min. and 300 cc/min. for $NH_3$.
6. The method of claim 5 wherein the said gas which is a source of oxygen is $O_2$ and its content in $O_2$-inert gas portion of the feed gases between about 0.01% to 98%.
7. The method of claim 1 wherein an inert carrier gas is used and its feed rate is between about 3 liters/min. and 20.5 liters/min.
8. The method of claim 7 wherein the said inert carrier gas is $N_2$.
9. The method of claim 1 wherein a source of boron is included in the reaction gases to dope the said deposit with boron.
10. The method of claim 9 wherein the source of boron is $B_2H_6$ gas.

* * * * *